US012750942B2

(12) United States Patent
Webb et al.

(10) Patent No.: US 12,750,942 B2
(45) Date of Patent: Sep. 29, 2026

(54) ION IMPLANTER AND LINEAR ACCELERATOR HAVING POLYGONAL BACKBONE

(71) Applicant: Applied Materials, Inc., Santa Clara, CA (US)

(72) Inventors: Aaron P. Webb, Austin, TX (US); Jason M. Schaller, Austin, TX (US); William Herron Park, Jr., Marblehead, MA (US); Wai Ming Tam, Georgetown, MA (US); Chris Czajka, Dripping Springs, TX (US); Michael C. Simmons, Austin, TX (US); Luke Bonecutter, Cedar Park, TX (US); David T. Blahnik, Round Rock, TX (US); Michael Mason Carrell, Leander, TX (US)

(73) Assignee: Applied Materials, Inc., Santa Clara, CA (US)

( * ) Notice: Subject to any disclaimer, the term of this patent is extended or adjusted under 35 U.S.C. 154(b) by 142 days.

(21) Appl. No.: 18/627,283

(22) Filed: Apr. 4, 2024

(65) Prior Publication Data

US 2025/0318041 A1 Oct. 9, 2025

(51) Int. Cl.
*H05H 9/04* (2006.01)
*H01J 37/08* (2006.01)
(Continued)

(52) U.S. Cl.
CPC ............ *H05H 9/045* (2013.01); *H01J 37/08* (2013.01); *H01J 37/3171* (2013.01);
(Continued)

(58) Field of Classification Search
CPC .......... H05H 9/045; H05H 7/001; H05H 7/02; H05H 7/22; H05H 2007/005;
(Continued)

(56) References Cited

U.S. PATENT DOCUMENTS 6,208,095 B1 3/2001 Divergilio
10,342,114 B2 7/2019 Satoh
(Continued)

FOREIGN PATENT DOCUMENTS

JP 2007157400 A 6/2007

OTHER PUBLICATIONS

International Search Report and Written Opinion for International Application No. PCT/US2025/018879, filing date, Mar. 7, 2025, 11 pages.

*Primary Examiner* — Renan Luque
(74) *Attorney, Agent, or Firm* — KDW Firm PLLC

(57) ABSTRACT

A linear accelerator apparatus may include a beamline enclosure that defines a polygonal backbone, and a plurality of acceleration stages, disposed along a length of the beamline enclosure. A given acceleration stage may include a drift tube assembly to conduct an ion beam therethrough, a resonator, coupled to deliver an RF signal to the drift tube assembly, and a quadrupole assembly to shape the ion beam. As such, at a first acceleration stage, a first resonator may be disposed along a first side of the polygonal backbone, and at a second acceleration stage, adjacent to and downstream of the first acceleration stage, a second resonator may be disposed along a second side of the polygonal backbone, different from the first side.

17 Claims, 6 Drawing Sheets

(51) Int. Cl.

| | |
|---|---|
| ***H01J 37/317*** | (2006.01) |
| ***H05H 7/00*** | (2006.01) |
| ***H05H 7/02*** | (2006.01) |
| ***H05H 7/22*** | (2006.01) |

(52) U.S. Cl.
CPC .............. *H05H 7/001* (2013.01); *H05H 7/02* (2013.01); *H05H 7/22* (2013.01); *H05H 2007/005* (2013.01); *H05H 2007/025* (2013.01); *H05H 2007/222* (2013.01)

(58) Field of Classification Search
CPC ....... H05H 2007/025; H05H 2007/222; H05H 2277/12; H05H 7/18; H01J 37/08; H01J 37/3171; H01J 2237/04735
See application file for complete search history.

(56) References Cited

U.S. PATENT DOCUMENTS

| | | | | |
|---|---|---|---|---|
| 2017/0238408 | A1* | 8/2017 | Lombardi .............. | H05H 9/045 315/505 |
| 2018/0330920 | A1 | 11/2018 | Sasaki et al. | |
| 2022/0183137 | A1 | 6/2022 | Sinclair et al. | |
| 2022/0285127 | A1* | 9/2022 | Sasaki ................. | H01J 37/3007 |

* cited by examiner

ION IMPLANTER AND LINEAR ACCELERATOR HAVING POLYGONAL BACKBONE

FIELD OF THE DISCLOSURE

The disclosure relates generally to ion implantation apparatus and more particularly to high energy beamline ion implanters.

BACKGROUND OF THE DISCLOSURE

Ion implantation is a process of introducing dopants or impurities into a substrate via bombardment. Ion implantation systems may comprise an ion source and a series of beam-line components. The ion source may comprise a chamber where ions are generated. The ion source may also comprise a power source and an extraction electrode assembly disposed near the chamber. The beam-line components, may include, for example, a mass analyzer, a first acceleration or deceleration stage, a collimator, and a second acceleration or deceleration stage. Much like a series of optical lenses for manipulating a light beam, the beam-line components can filter, focus, and manipulate ions or ion beam having particular species, shape, energy, and/or other qualities. The ion beam passes through the beam-line components and may be directed toward a substrate mounted on a platen or clamp.

Implantation apparatus capable of generating ion energies of approximately 1 MeV or greater are often referred to as high energy ion implanters, or high energy ion implantation systems. One type of high energy ion implanter is termed linear accelerator, or LINAC, where a series of electrodes arranged as tubes conduct and accelerate the ion beam to increasingly higher energy along the succession of tubes, where the electrodes receive a powered voltage signal. Known LINACs are driven by an RF voltage of frequency in the 13.56 MHz-120 MHz range.

Among ongoing challenges for LINAC design include the relatively large size and beamline length required by a linear accelerator, the need for serviceability of multiple components of the linear accelerator, and the desire to preserve or improve function of the linear accelerator for any given design.

With respect to these and other considerations the present disclosure is provided.

BRIEF SUMMARY

In one embodiment, a linear accelerator apparatus is provided. The linear accelerator apparatus may include a beamline enclosure that defines a polygonal backbone, and a plurality of acceleration stages, disposed along a length of the beamline enclosure. A given acceleration stage may include a drift tube assembly to conduct an ion beam therethrough, a resonator, coupled to deliver an RF signal to the drift tube assembly, and a quadrupole assembly to shape the ion beam. As such, at a first acceleration stage, a first resonator may be disposed along a first side of the polygonal backbone, and at a second acceleration stage, adjacent to and downstream of the first acceleration stage, a second resonator may be disposed along a second side of the polygonal backbone, different from the first side.

In another embodiment, an ion implanter may include an ion source to generate a continuous ion beam at a first energy, and a linear accelerator, to receive the continuous ion beam, generate a bunched ion beam from the continuous ion beam, and accelerate the bunched ion beam to a second energy. The linear accelerator may include a beamline enclosure that defines a polygonal backbone, and a plurality of acceleration stages, disposed along a length of the beamline enclosure. A given acceleration stage may include a drift tube assembly to conduct an ion beam therethrough, a resonator, coupled to deliver an RF signal to the drift tube assembly, and a quadrupole lens to shape the ion beam. As such, at a first acceleration stage, a first resonator may be disposed along a first side of the polygonal backbone, and at a second acceleration stage, adjacent to and downstream of the first acceleration stage, a second resonator may be disposed along a second side of the polygonal backbone, different from the first side.

In another embodiment, a linear accelerator may include a frame, a beamline enclosure that defines a hexagonal backbone and is attached to the frame, a buncher assembly, attached to at least one side of the beamline enclosure, a pump assembly, attached to a first vertical side of the beamline enclosure, a quadrupole assembly, attached to a second vertical side of the beamline enclosure, and a plurality of resonators, attached to the beamline enclosure. As such, a first resonator may be disposed along a first side of the hexagonal backbone, different from the first vertical side and the second vertical side, and a second resonator may be disposed along a second side of the hexagonal backbone, different from the first side, the first vertical side, and the second vertical side.

Figure 2:
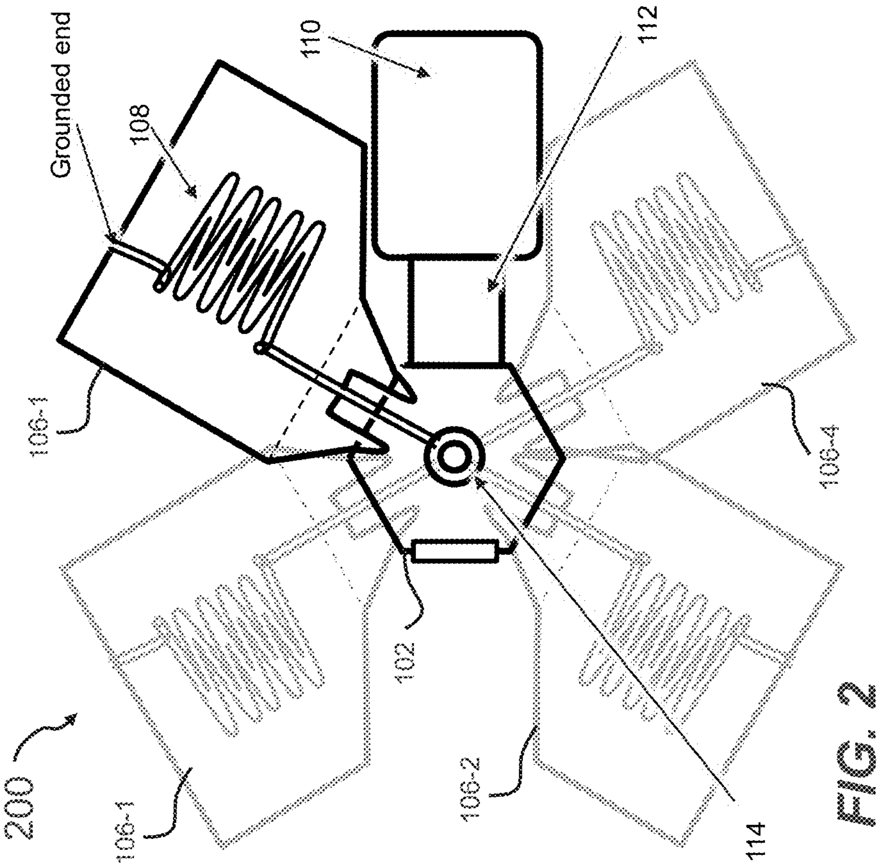
FIG. 2 shows and end view of another exemplary apparatus, according to embodiments of the disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

An apparatus, system and method in accordance with the present disclosure will now be described more fully hereinafter with reference to the accompanying drawings, where embodiments of the system and method are shown. The system and method may be embodied in many different forms and are not be construed as being limited to the embodiments set forth herein. Instead, these embodiments are provided so this disclosure will be thorough and complete, and will fully convey the scope of the system and method to those skilled in the art.

Terms such as "top," "bottom," "upper," "lower," "vertical," "horizontal," "lateral," and "longitudinal" may be used herein to describe the relative placement and orientation of these components and their constituent parts, with respect to the geometry and orientation of a component of a semiconductor manufacturing device as appearing in the figures. The terminology may include the words specifically mentioned, derivatives thereof, and words of similar import.

As used herein, an element or operation recited in the singular and proceeded with the word "a" or "an" are understood as potentially including plural elements or operations as well. Furthermore, references to "one embodiment" of the present disclosure are not intended to be interpreted as precluding the existence of additional embodiments also incorporating the recited features.

Provided herein are approaches for improved architecture for a linear accelerator and ion implanters based upon linear accelerators. For brevity, an ion implantation system may also be referred to herein as an "ion implanter."

Figure 1:
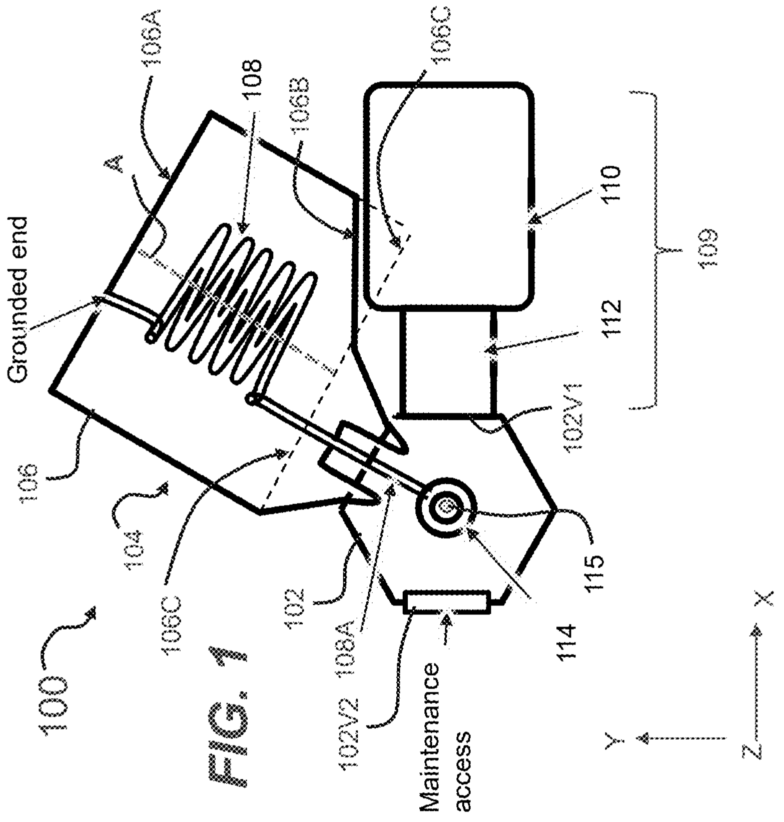
FIG. 1 shows an end view of exemplary apparatus according to embodiments of the disclosure.

FIG. 1 shows an exemplary apparatus according to embodiments of the disclosure. The apparatus 100 may represent portions of a linear accelerator, such as a linear accelerator arranged within an ion implanter, as discussed below with respect to FIG. 4. The apparatus 100 includes a drift tube assembly 114 and associated components for accelerating an ion beam in an acceleration stage of a linear accelerator. In particular, the apparatus 100 illustrates an end view of a portion of a linear accelerator where an ion beam is to be conducted through the drift tube assembly along a direction of propagation that parallels the Z-axis of the Cartesian coordinate system shown. The apparatus 100 includes a beamline enclosure 102 that may be evacuated to very low pressure as known in the art for linear accelerators in order to conduct an ion beam therethrough. For example, the vacuum level in the beamline enclosure may be such that the ions of an ion beam travel therethrough in a collisionless manner. The drift tube assembly 114 may include various drift tube electrodes as known in the art to accelerate an ion beam 115 therethrough. As known in the art, the drift tube assembly 114 may include a plurality of drift tubes that define a triple gap configuration or a double gap configuration, according to different non-limiting embodiments.

According to various embodiments of the disclosure, the beamline enclosure 102 may define a polygonal backbone. As used herein, the term "polygonal backbone" may refer to a beamline enclosure structure having five or more sides as viewed along the beamline, such as along the Z-axis. Non-limiting examples of a polygonal backbone include a hexagonal backbone, an octagonal backbone, and so forth. In particular embodiments, the beamline enclosure 102 may define a hexagonal backbone, having six sides, where the hexagonal backbone extends along the Z-axis. The hexagonal backbone provides a series of sides that accommodate the attachment of various components forming a linear accelerator. In the embodiment of FIG. 1, the architecture representing components of one stage of a linear accelerator is shown.

As depicted, the hexagonal backbone includes a pair of vertical sides. As such, a pump assembly 109 may be attached to a first vertical side 102V1, while a second vertical side 102V2 provides access, such as maintenance access. As depicted in FIG. 1, the pump assembly 109 may include a pump chamber 112, disposed directly along the first vertical side 102V1, as well as a pump 110, coupled to the pump chamber. The pump chamber 112 may function as a known pump chase that is used in linear accelerators to conduct particles to the pump(s) 110. The placement the pump assembly 109 may generally be along any side of the beamline enclosure 102, while placement along a vertical side facilitates better serviceability.

As further shown in FIG. 1, a resonator 104 is attached to another side of the beamline enclosure 102. The resonator 104 includes a resonator enclosure 106 and resonator coil 108, disposed in the resonator enclosure 106. The resonator coil 108 includes an extension 108A that connects to the drift tube assembly 114. In particular, the resonator coil 108 will attach to a powered drift tube of the drift tube assembly 114 to drive an RF voltage on the drift tube assembly 114. For clarity, the resonator coil 108 is illustrated as coil suitable for implementation in a double gap accelerator configuration, in that just one powered end is connected to a single drift tube. However, in other embodiments, a resonator may include a resonator coil for driving a pair of RF drift tubes that define a triple gap acceleration configuration. Note that the grounded end of the resonator coil 108 and the extension 108A are displaced off of the cylinder axis A of the resonator chamber 106. This displacement enables a within the same total volume.

A hallmark of the resonator 104 is that the resonator enclosure 106 has an angled face in the end view of FIG. 1. In particular, the resonator enclosure 106 may have a generally cylindrical shape that has a first end face 106A (on the grounded side, facing away from the horizontal backbone) that is normal to the cylinder axis A of the resonator enclosure 106. The resonator enclosure has a second end face 106B that defines a second plane that is arranged at a non-normal inclination to the cylinder axis A. The angling of the second end face 106B allows the resonator enclosure 106 to be arranged adjacent to the pump assembly 109, while still preserving sufficient volume for the resonator coil 108 and the resonator 104 as a whole. Advantages of this architecture are further explained with respect to the embodiments to follow. However, note that the angling of the second end face 106B allows placement of the resonator 104 close to the hexagonal backbone, while still providing access for maintenance and the placement of other components along the vertical sides of the beamline enclosure 102. For example, were the resonator 104 configured with an end face 106C, parallel to the first end face 106A, the resonator 104 would overlap with the pump 110, as shown by the dashed line. Thus, a portion of the end face 106C is truncated and angled to form the second end face 106B.

FIG. 2 shows an end view of another exemplary apparatus, according to embodiments of the disclosure. The apparatus 200 includes similar components to the apparatus 100, with like parts labeled the same. In this example, a plurality of resonators are attached to the hexagonal backbone of the beamline enclosure 102. In this embodiment the apparatus 200 represents a multi-stage linear accelerator, in this case, four stages. The four different stages of the linear accelerator are represented by four different resonators, labeled as resonator 106-1, resonator 106-2, resonator 106-3, and resonator 106-4. In the end view of FIG. 2, it may be understood that the different resonators are disposed along the length of the beamline enclosure 102, meaning along the Z-axis. In the apparatus 200, the different resonators are mutually disposed along different sides of the hexagonal backbone, in this case, non-vertical sides. As further illustrated in the embodiments to follow, this configuration allows a more efficient arrangement of components in a linear accelerator, providing relative compactness and accessibility.

Figure 3A:
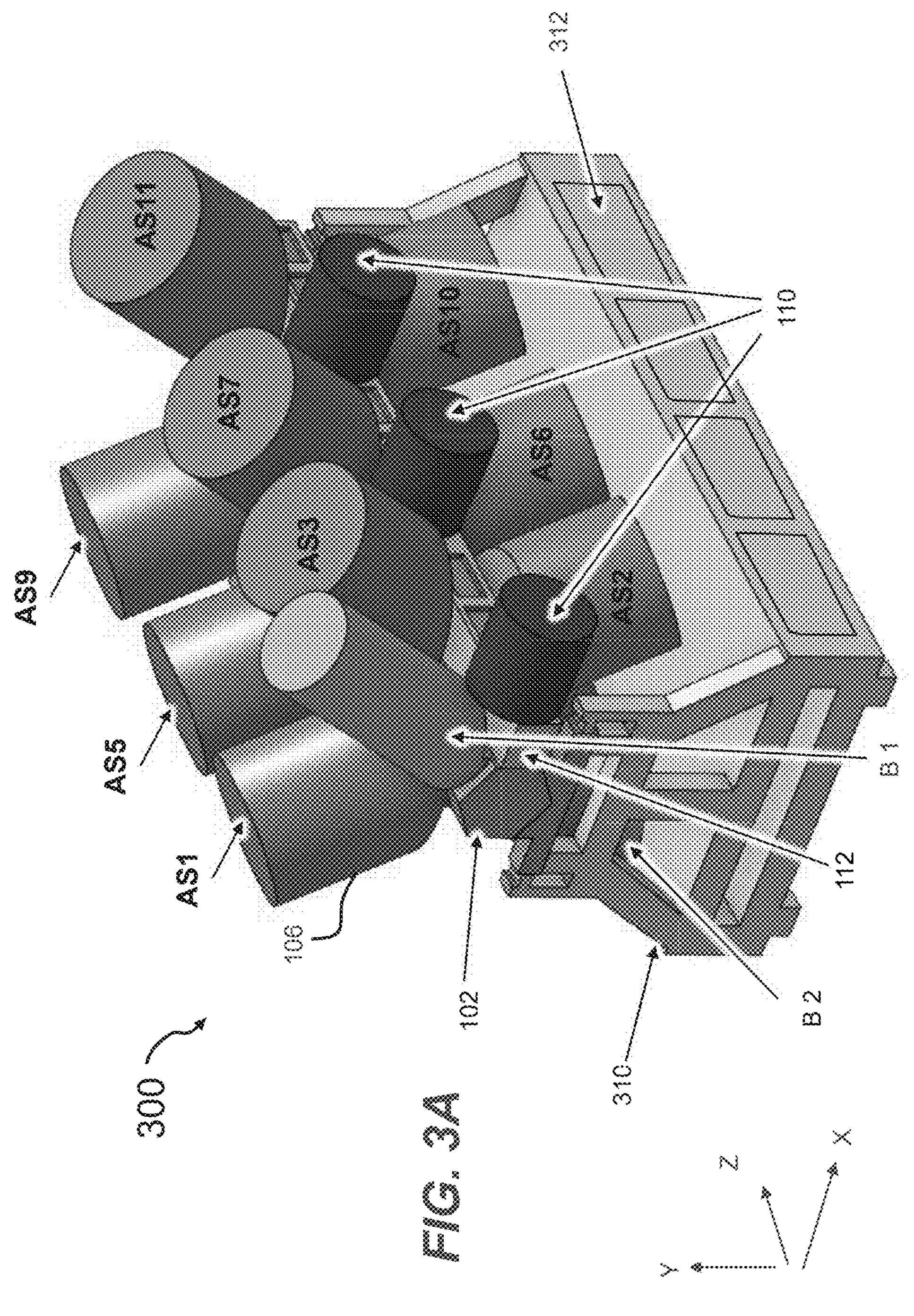
FIG. 3A shows a first perspective view of a further exemplary apparatus, according to embodiments of the disclosure.
Figure 3B:
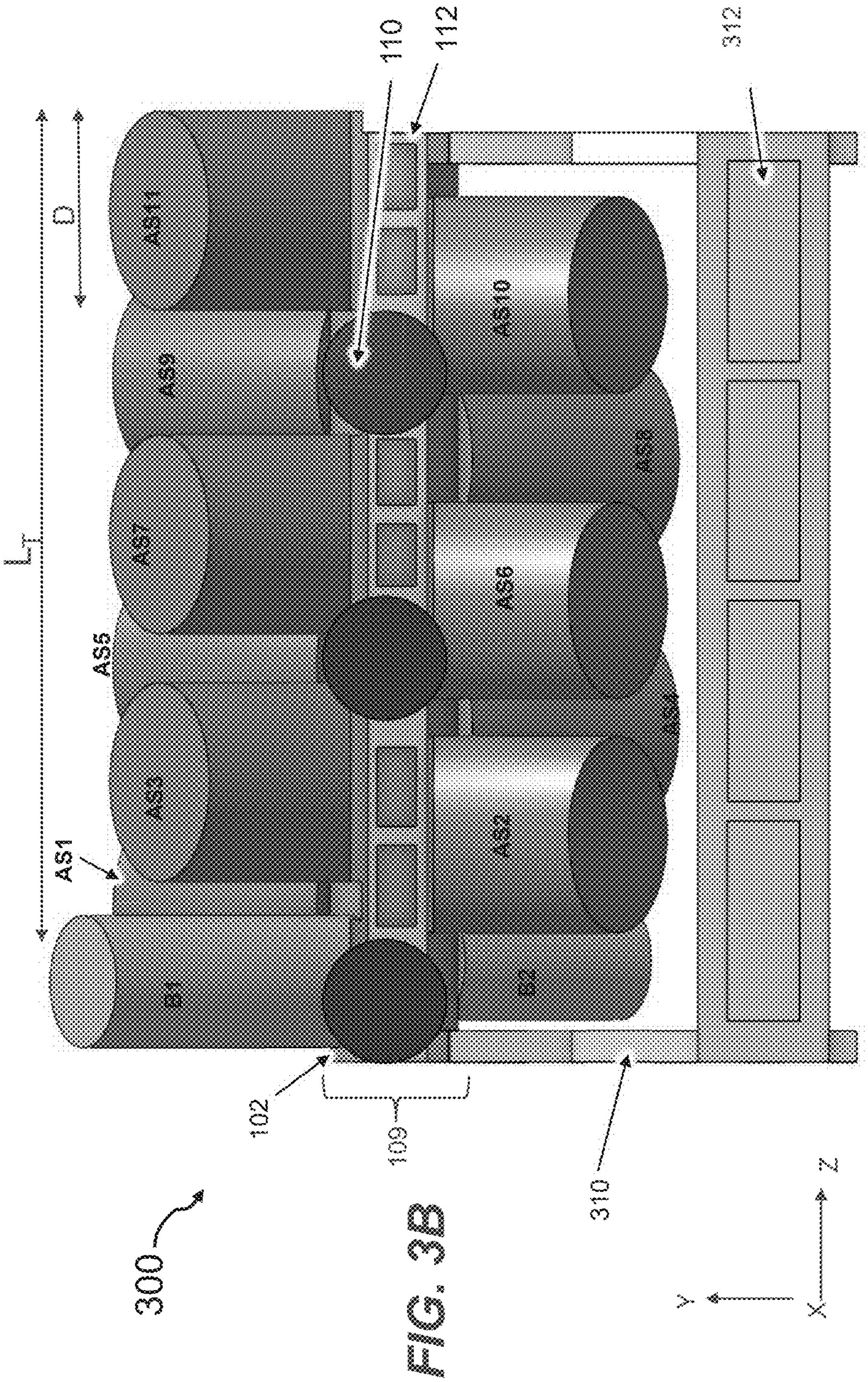
FIG. 3B shows a top/side view of the apparatus of FIG. 3A.
Figure 3C:
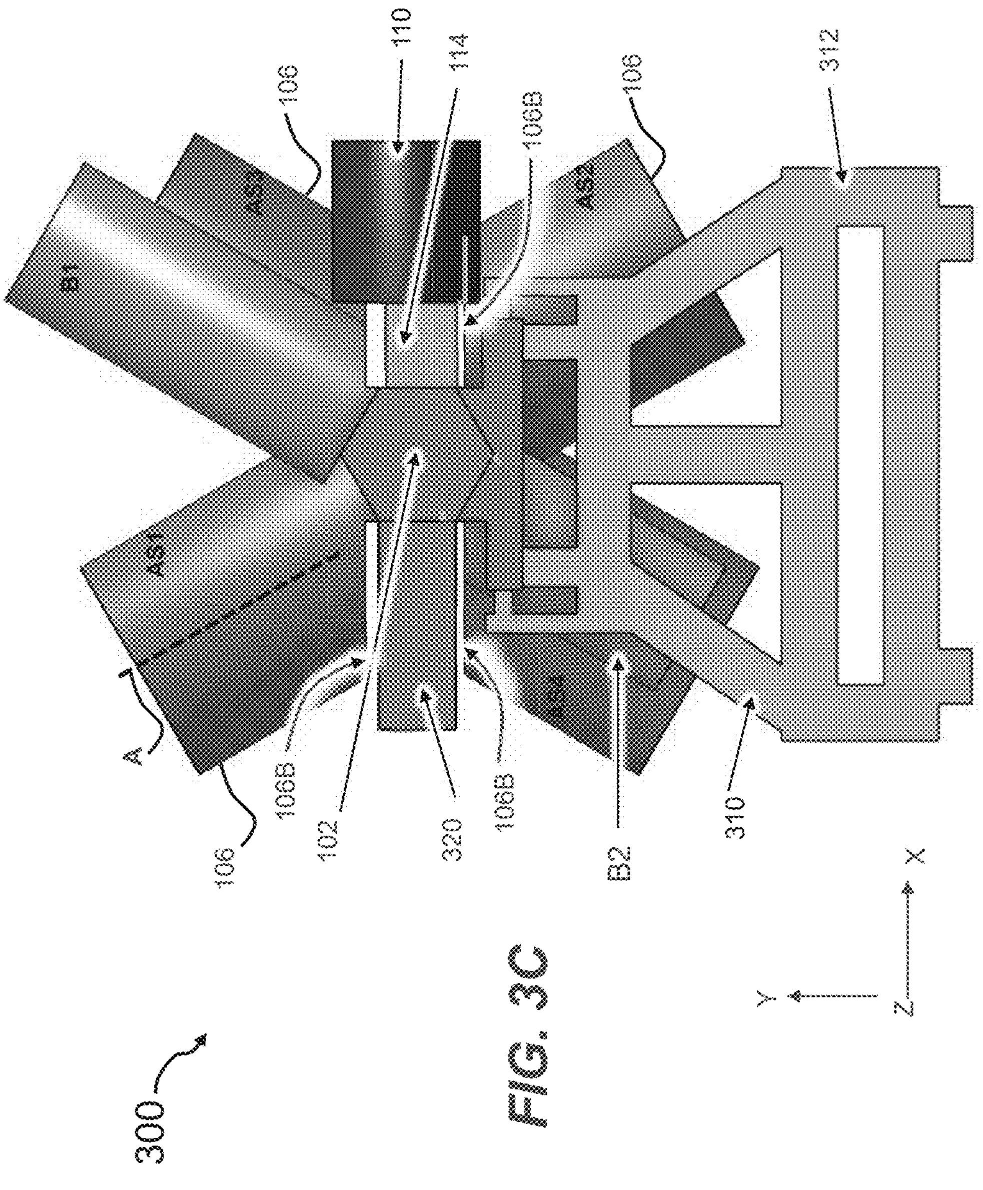
FIG. 3C shows an end view of the apparatus of FIG. 3A.
Figure 3D:
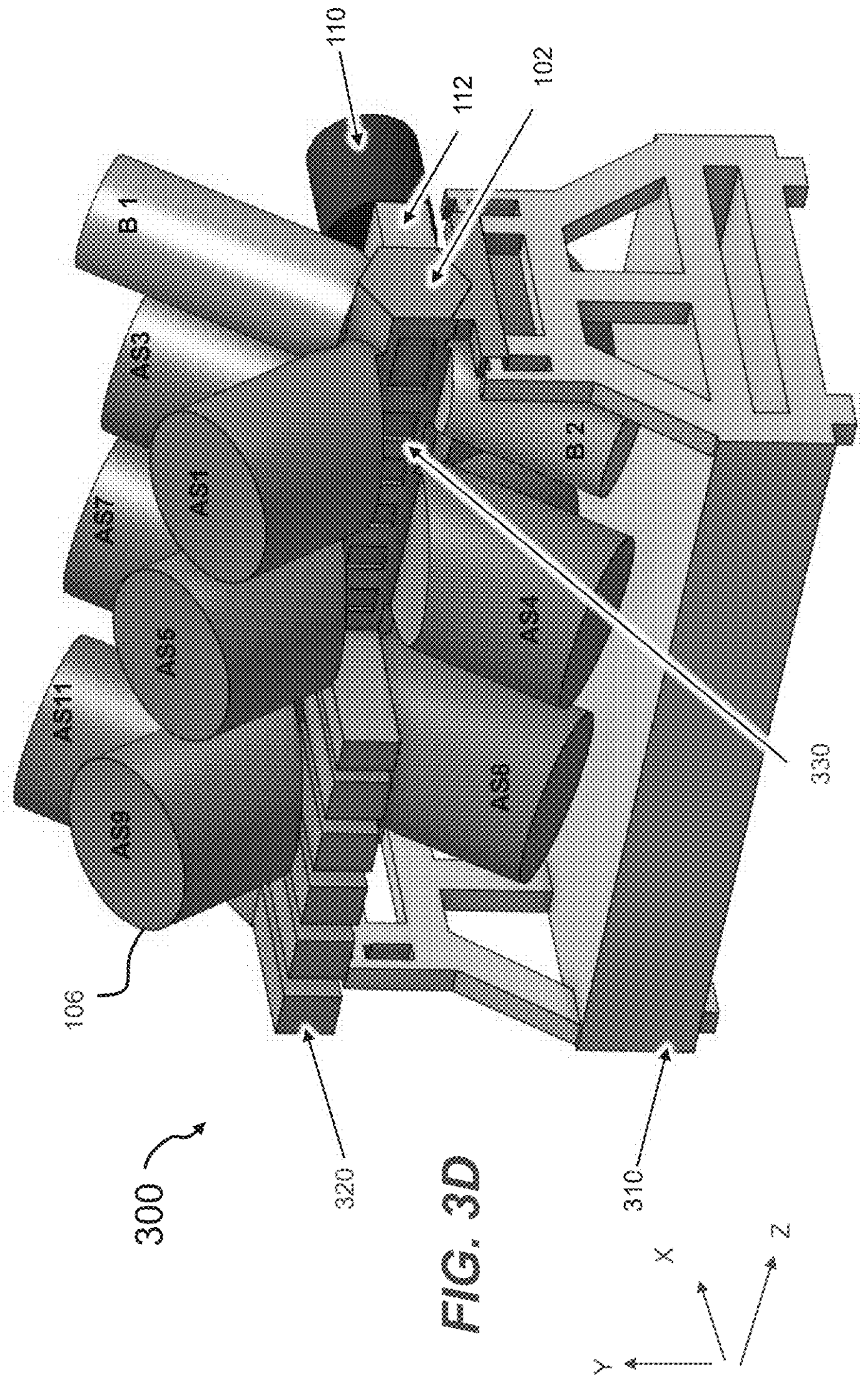
FIG. 3D shows a second perspective view of the apparatus of FIG. 3A.

FIG. 3A shows a first perspective view of a further exemplary apparatus, according to embodiments of the disclosure. The apparatus 300 represents a linear accelerator that may include up to 12 acceleration stages. The different stages are represented by different resonators and are labeled as AS1, AS2, AS3, AS4, AS5, AS6, AS7, AS8, AS9, AS10, AS11, etc. FIG. 3B shows a top/side view of the apparatus of FIG. 3A, FIG. 3C shows an end view of the apparatus of FIG. 3A, and FIG. 3D shows a second perspective view of the apparatus of FIG. 3A.

The apparatus 300 includes a frame 310 and a power assembly interface 312, As shown, the beamline enclosure 102 is arranged on the frame 310, and the various components of the acceleration stages are arranged on different sides of the beamline enclosure 102. The different acceleration stages are identified by individual resonator enclosures, enclosures 106, and are labeled in sequence along the beamline in increasing number. Thus, the most upstream acceleration stage of the apparatus 300 is labeled as AS1, the next downstream acceleration stage AS2, the next acceleration stage AS3, etc. The architecture of the apparatus 300 is such that every fourth resonator (acceleration stage) is arranged along the same side of the hexagonal backbone. In other words, successive resonators are arranged in a staggered manner, such that any given resonator spaced on a given side of the hexagonal backbone is spaced apart from a next resonator on the same given side of the hexagonal backbone by three additional resonators. Said differently, any two resonators connected to the same side of the hexagonal backbone correspond to acceleration stages that are related to one another as X, X+4, or X+8. Thus, the acceleration stages denoted by AS1, AS5, AS9, are arranged along the same first side, AS3, AS7, and AS11, are arranged along a same second side, AS2, AS6, and AS10 are arranged along a same third side, etc.

With reference in particular to FIG. 3B, in this manner, the staggering of resonators provides for a compact linear accelerator design. In particular, the distance LT represents the total distance along the Z-axis from the most upstream point of AS1 to the most downstream point of AS11, representing 11 acceleration stages. Were the resonators to be arranged along the same side of the hexagonal backbone, the total distance required for LT would correspond to at least 11×D where D is equal to the width or diameter of the resonator as shown. In the embodiment of FIG. 3B, with the staggered resonator design, this distance LT is actually equal to just over 4×D.

As shown in FIG. 3A and FIG. 3B, the pump assembly 109 may include a plurality of three of the pumps 110 that are connected to the pump chamber 112 at various locations along the length of the hexagonal backbone. In one example, the pumps 110 may have a dimension and shape that is arranged so as not to interfere with the spacing of the resonators 106.

Turning also to FIG. 3B and FIG. 3C, the apparatus 300 may further include a set of bunchers, disposed upstream of the acceleration stages (AS1-AS11). In the embodiment depicted, the set of bunchers includes a first buncher B1 and a second buncher B2. Both bunchers of the set of bunchers are arranged on non-vertical sides of the horizontal backbone, in this case, on opposite sides to one another. Note that the buncher B1 and buncher B2 are each formed of respective resonators that perform in a manner similar to the resonators of the acceleration stages (AS1-AS11). Thus, the buncher B1 will be coupled to a RF powered drift tube as part of a buncher drift tube assembly within the beamline enclosure 102. The drift tube assembly (Not shown) in the buncher B1 will receive a continuous ion beam and output a bunched ion beam, according to the frequency of the RF signal that drives buncher B1.

The buncher B1 and buncher B2 may have cylindrically shaped resonator chambers that also include an angled end face that is adjacent the hexagonal backbone, as shown for buncher B2 in FIG. 3D. This angled end face (not perpendicular to the cylinder axis of the buncher) allows for more compact placement of the bunchers in a manner that does not interfere with other components of the apparatus 300.

In one example, the first buncher B1 is driven by a first RF signal at a first frequency, while the second buncher B2 is driven by a second RF signal at a second frequency, twice the first frequency. A suitable non-limiting example of a first frequency is 13.56 MHz, and second frequency of 27.1 MHz. By treating the bunched ion beam output at a given first frequency using a bunching frequency twice that of the given first frequency, the buncher B2 may output a bunched ion beam having more uniform energy and less spread, for example.

Turning in particular to FIG. 3D, the apparatus 300 may include a quadrupole assembly 320, arranged along the second vertical side 102V2. The quadrupole assembly 320 includes drive components that drive power to quadrupole electrodes that are arranged within the beamline enclosure 102. As an example, a quadrupole electrode may be arranged at each acceleration stage of the apparatus 300. The quadrupole electrode may shape the ion beam as the ion beam passes between a first acceleration stage and a next acceleration stage. As illustrated in FIG. 3D, the quadrupole drive components of the quadrupole assembly 320 may be arranged as box-like units that are readily detachable from the beamline enclosure 102, for ready servicing. Note that detachment of the quadrupole assembly 320 from the beamline enclosure 102 provides access for servicing other components within the beamline enclosure 102.

Note that while the aforementioned embodiment of FIGS. 3A-3D illustrates a linear accelerator having 11 main acceleration stages and two bunchers, in other embodiments, a linear accelerator may have a greater number of acceleration stages, or fewer acceleration stages, and may include just one buncher. The novel architecture of the present embodiments provides a relatively compact and accessibly LINAC design that does not sacrifice performance. Generally, the hexagonal backbone facilitates staggering resonators in adjacent acceleration stages around different sides of the beamline enclosure in a manner that allows for relatively larger resonator chambers, while still providing easy access to the beamline enclosure along at least one side.

It is to be noted that the present embodiments, using a hexagonal beamline enclosure, require that the stem distance of the coil extension inside the beamline enclosure is relatively longer than comparable distances for known linear accelerators based upon rectangular beamline enclosure design. This relatively longer distance may require slightly more power to drive a given drift tube electrode for a target accelerating voltage. However, the hexagonal backbone architecture of the present embodiments facilitates relatively larger resonator size that drives more power, while not requiring greater beamline footprint, for the reasons detailed above.

Figure 4:
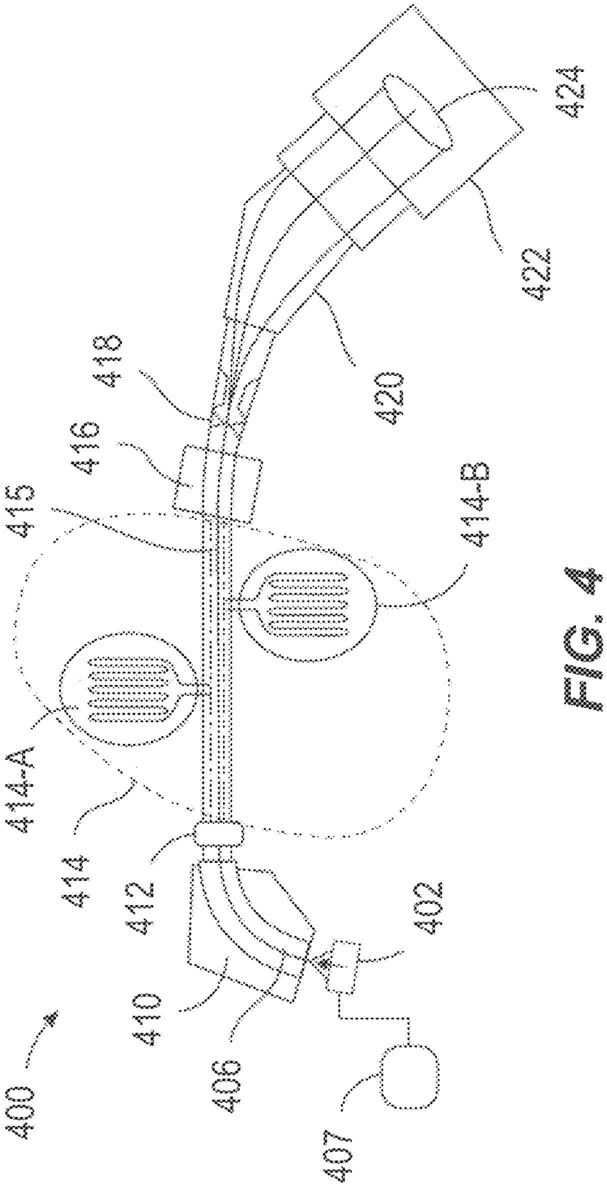
FIG. 4 depicts an exemplary ion implanter according to embodiments of the disclosure.

FIG. 4 depicts a schematic of an ion implanter, according to embodiments of the disclosure. The ion implanter 400 includes acceleration stages 414-A, 414-B of a LINAC, shown as linear accelerator 414. The ion implanter 400, may represent a beamline ion implanter, with some elements not shown for clarity of explanation. The ion implanter 400 may include an ion source 402, and a gas box 407 as known in the art. The ion source 402 may include an extraction system including extraction components and filters (not shown) to generate an ion beam 406 at a first energy. Examples of suitable ion energy for the first ion energy range from 5 keV to 100 keV, while the embodiments are not limited in this context. To form a high energy ion beam, the ion implanter 800 includes various additional components for accelerating the ion beam 806.

The ion implanter 400 may include an analyzer 410, functioning to analyze the ion beam 406 as in known apparatus, by changing the trajectory of the ion beam 406, as shown. The ion implanter 400 may also include a buncher assembly 412, arranged with one or two bunchers, for example, as disclosed above. As further shown in FIG. 4, the ion implanter 400 may include a linear accelerator 414 (shown in the dashed line), disposed downstream of the buncher assembly 412, where the linear accelerator 414 is arranged to accelerate the ion beam 406 to form a high energy ion beam 415, greater than the ion energy of the ion beam 406, before entering the linear accelerator 414. The buncher assembly 412 may receive the ion beam 406 as a continuous ion beam and output the ion beam 406 as a bunched ion beam to the linear accelerator 414. The linear accelerator 414 may include a plurality of acceleration stages (814-A, 814-B, . . . to 814-Z (not shown)), arranged in series, as shown. In various embodiments, the ion energy of the high energy ion beam 415 may represent the final ion energy for the ion beam 406, or approximately the final ion energy. In various embodiments, the ion implanter 400 may include additional components, such as filter magnet 416, a scanner 418, collimator 420, where the general functions of the scanner 418 and collimator 420 are well known and will not be described herein in further detail. As such, a high energy ion beam, represented by the high energy ion beam 415, may be delivered to an end station 422 for processing a substrate 424. Non-limiting energy ranges for the high energy ion beam 415 include 500 keV-10 MeV, where the ion energy of the ion beam 406 is increased in steps through the various acceleration stages of the linear accelerator 414. In accordance with various embodiments of the disclosure, the acceleration stages of the linear accelerator 414 may be arranged around a beamline enclosure that has a hexagonal shape in the linear accelerator 414, as detailed above. of the integrated quadrupole configurations.

In view of the above, the present disclosure provides at least the following advantages. For one advantage, the provision of a polygonal backbone, such as a hexagonal backbone provides increased area for mounting components compared to a backbone with a cross-section having fewer sides, such as a rectangle, for example. For another advantage a polygonal backbone enables dedicated service access regions that are not available in a beamline enclosure with a rectangular backbone, for example. As additional advantages, a beamline enclosure of the present embodiments having a polygonal backbone enables more options for resonator placement and higher efficiency of space usage.

While certain embodiments of the disclosure have been described herein, the disclosure is not limited thereto, as the disclosure is as broad in scope as the art will allow and the specification may be read likewise. Therefore, the above description are not to be construed as limiting. Those skilled in the art will envision other modifications within the scope and spirit of the claims appended hereto.

The invention claimed is:

1. A linear accelerator apparatus, comprising:
- a beamline enclosure that defines a polygonal backbone;
- a plurality of acceleration stages, comprising a set of at least four acceleration stages, disposed along a length of the beamline enclosure, wherein a given acceleration stage comprises:
- a drift tube assembly to conduct an ion beam therethrough;

- a resonator, coupled to deliver an RF signal to the drift tube assembly; and
- a quadrupole assembly to shape the ion beam,
- wherein at a first acceleration stage, a first resonator is disposed along a first side of the polygonal backbone, and at a second acceleration stage, adjacent to and downstream of the first acceleration stage, a second resonator is disposed along a second side of the polygonal backbone, different from the first side,
- wherein at a third acceleration stage, a third resonator is disposed along a third side of the polygonal backbone, different from the first side and the second side, and
- wherein at a fourth acceleration stage, a fourth resonator is disposed along a fourth side of the polygonal backbone, different from the first side, the second side, and the third side.

2. The linear accelerator apparatus of claim 1, wherein the polygonal backbone comprises a pair of vertical sides, wherein the quadrupole assembly is disposed along a first vertical side of the polygonal backbone, wherein the given acceleration stage further comprises:
- a pump assembly, disposed along a second vertical side of the polygonal backbone.

3. The linear accelerator apparatus of claim 2, wherein the pump assembly comprises:
- a pump chamber, disposed directly along the second vertical side; and
- a plurality of pumps, coupled to the pump chamber.

4. The linear accelerator apparatus of claim 2, wherein the resonator comprises a resonator enclosure having a shape in the form of a cylinder,
- wherein the resonator enclosure has a first end face defining a first plane that is arranged normal to a cylinder axis of the cylinder and facing away from the horizontal backbone, and a second end face defining a second plane that is arranged at a non-normal inclination to the cylinder axis, and
- wherein the second end face is disposed adjacent to the quadrupole assembly or adjacent to the pump assembly.

5. The linear accelerator apparatus of claim 1, further comprising a buncher assembly, disposed upstream of the plurality of acceleration stages, the buncher assembly further comprising:
- a first buncher, arranged along a first given side of the polygonal backbone; and
- a second buncher, disposed downstream of the first buncher and arranged along a second given side of the polygonal backbone, where the second given side is disposed opposite to the first given side, wherein the first buncher is coupled to receive a first RF signal at a first frequency, and wherein the second buncher is coupled to receive a second RF signal at a second frequency, twice the first frequency.

6. The linear accelerator apparatus of claim 5, wherein the first frequency is 13.56 MHz.

7. An ion implanter, comprising:
- an ion source to generate a continuous ion beam at a first energy; and
- a linear accelerator, to receive the continuous ion beam, generate a bunched ion beam from the continuous ion beam, and accelerate the bunched ion beam to a second energy, the linear accelerator comprising:
- a beamline enclosure that defines a polygonal backbone;
- a plurality of acceleration stages, comprising a set of at least four acceleration stages, disposed along a length of the beamline enclosure, wherein a given acceleration stage comprises:

a drift tube assembly to conduct an ion beam therethrough;

a resonator, coupled to deliver an RF signal to the drift tube assembly; and a quadrupole assembly to shape the ion beam, wherein at a first acceleration stage, a first resonator is disposed along a first side of the polygonal backbone, and at a second acceleration stage, adjacent to and downstream of the first acceleration stage, a second resonator is disposed along a second side of the polygonal backbone, different from the first side, wherein at a third acceleration stage, a third resonator is disposed along a third side of the polygonal backbone, different from the first side and the second side, and wherein at a fourth acceleration stage, a fourth resonator is disposed along a fourth side of the polygonal backbone, different from the first side, the second side, and the third side.

8. The ion implanter of claim 7, wherein the polygonal backbone comprises a pair of vertical sides, wherein the quadrupole assembly is disposed along a first vertical side of the polygonal backbone, wherein the given acceleration stage further comprises:

a pump assembly, disposed along a second vertical side of the polygonal backbone.

9. The ion implanter of claim 8, wherein the pump assembly comprises:

a pump chamber, disposed directly along the second vertical side; and a plurality of pumps, coupled to the pump chamber.

10. The ion implanter of claim 8, wherein the resonator comprises a resonator enclosure having a shape in a form of a cylinder, wherein the resonator enclosure has a first end face defining a first plane that is arranged normal to a cylinder axis of the cylinder and facing away from the polygonal backbone, and a second end face defining a second plane that is arranged at a non-normal inclination to the cylinder axis, and wherein the second end face is disposed adjacent to the quadrupole assembly or adjacent to the pump assembly.

11. The ion implanter of claim 7, further comprising a buncher assembly, disposed upstream of the plurality of acceleration stages, the buncher assembly further comprising:

a first buncher, arranged along a first given side of the polygonal backbone; and a second buncher, disposed downstream of the first buncher and arranged along a second given side of the polygonal backbone, where the second given side is disposed opposite to the first given side, wherein the first buncher is coupled to receive a first RF signal at a first frequency, and wherein the second buncher is coupled to receive a second RF signal at a second frequency, twice the first frequency.

12. The ion implanter of claim 11, wherein the first frequency is 13.56 MHz.

13. A linear accelerator, comprising:

a frame;

a beamline enclosure that defines a hexagonal backbone and is attached to the frame;

a buncher assembly, attached to at least one side of the beamline enclosure;

a pump assembly, attached to a first vertical side of the beamline enclosure;

a quadrupole assembly, attached to a second vertical side of the beamline enclosure; and a plurality of resonators, attached to the beamline enclosure, comprising a set of at least four resonators, wherein a first resonator is disposed along a first side of the hexagonal backbone, different from the first vertical side and the second vertical side, and wherein a second resonator is disposed along a second side of the hexagonal backbone, different from the first side, the first vertical side, and the second vertical side, wherein a third resonator is disposed along a third side of the hexagonal backbone, different from the first side and the second side, and wherein a fourth resonator is disposed along a fourth side of the hexagonal backbone, different from the first side, the second side, and the third side.

14. The linear accelerator of claim 13, wherein the linear accelerator comprises a plurality of acceleration stages, wherein the hexagonal backbone comprises a pair of vertical sides, wherein the quadrupole assembly is disposed along a first vertical side of the polygonal backbone, wherein a given acceleration stage of the plurality of acceleration stages further comprises:

a pump assembly, disposed along a second vertical side of the hexagonal backbone.

15. The linear accelerator of claim 14, wherein the pump assembly comprises:

a pump chamber, disposed directly along the second vertical side; and a plurality of pumps, coupled to the pump chamber.

16. The linear accelerator of claim 14, further comprising a buncher assembly, disposed upstream of the plurality of resonators, the buncher assembly further comprising:

a first buncher, arranged along a first given side of the hexagonal backbone; and a second buncher, disposed downstream of the first buncher and arranged along a second given side of the hexagonal backbone, where the second given side is disposed opposite to the first given side, wherein the first buncher is coupled to receive a first RF signal at a first frequency, and wherein the second buncher is coupled to receive a second RF signal at a second frequency, twice the first frequency.

17. The linear accelerator of claim 16, wherein the first frequency is 13.56 MHz.

* * * * *